Oct. 5, 1965 H. B. ROSENBERG ETAL 3,210,618
SEALED SEMICONDUCTOR HOUSINGS
Filed June 2, 1961

INVENTORS
HAROLD B. ROSENBERG
JACK WEINER
BY
Kenyon & Kenyon
ATTORNEYS 3,210,618

SEALED SEMICONDUCTOR HOUSINGS

Harold B. Rosenberg, New Rochelle, and Jack Weiner, Flushing, N.Y., assignors to Electronic Devices, Inc., New Rochelle, N.Y., a corporation of Delaware Filed June 2, 1961, Ser. No. 114,507
1 Claim. (Cl. 317—234)

The present invention relates generally to housings for semiconductive elements, and more particularly to protectively sealed rectifier units.

Dry contact rectifiers or junction diodes are usually constructed of thin and brittle wafers of germanium or silicon. These semiconductive materials are light-sensitive and are subject to corrosion and change of electrical properties under humid conditions. They are also susceptible to abrasion and mechanical shock. Protective coverings are therefore essential for shielding the fragile wafer both mechanically and chemically in order to maintain the uniformity and stability of the electrical characteristics of the rectifier.

Another problem arising in connection with rectifiers of the semiconductor type is with respect to heat developed during use. Excessive heat may impair the operation of the rectifier if it is subjected to heavy loads while at elevated temperatures. It is necessary, therefore, to mount the wafer on a metal having good thermal conductivity so that the heat developed may be dissipated rapidly and efficiently.

In assembling silicon or germanium wafers, it is also necessary to solder the base contact member thoroughly and uniformly to a base mount to assure good thermal and electrical contact therebetween. Since the sensitive edge of the wafer is usually etched to provide a clean surface free of impurities, it is important when mounting the wafer that no solder be permitted to contaminate the etched surface and thereby short-circuit the device.

While various forms of rectifier housings have heretofore been known, none of these housings satisfies all of the above-noted conditions requisite to optimum operating efficiency. For example, while there are housings in which the wafer is soldered to a metal mount to provide a heat sink, the arrangement is such as to be susceptible to contamination of the junction surface by the solder. In other cases, where the wafer is suspended within a housing and hermetically sealed therein, heat dissipation is poor and the wafer tends to overheat.

Accordingly, it is the principal object of this invention to provide a protectively housed semiconductor element of improved design which overcomes the drawbacks of prior art devices and acts to maintain the uniformity and stability of the characteristics of the element.

More specifically, it is an object of the invention to provide a packaged rectifier in which the semiconductive wafer is chemically and mechanically shielded and which acts rapidly to dissipate the heat developed in use.

Also an object of the invention is to provide a packaged diode of the above-noted type which may be either hermetically sealed or potted.

Still another object of the invention is to provide a packaged rectifier having superior electrical and mechanical characteristics and which may be manufactured at relatively low cost.

Briefly stated, these objects are attained in a housing structure in the form of a metallic cup whose base is provided with a central pedestal serving as a mount for the semiconductor wafer, the diameter of the wafer exceeding that of the pedestal whereby the junction surface is maintained free and clear of all contaminants, the cup acting as both a shield and a heat sink and being either hermetically sealed or filled with a potting compound.

For a better understanding of the invention, as well as other objects and features thereof, reference is made to the following detailed description to be read in conjunction with the accompanying drawing, wherein FIG. 1 is a longitudinal section taken through a preferred embodiment of a packaged diode of the potted type in accordance with the invention.

Figures 1, 2, 3, 4, 4A, 5, 5A:
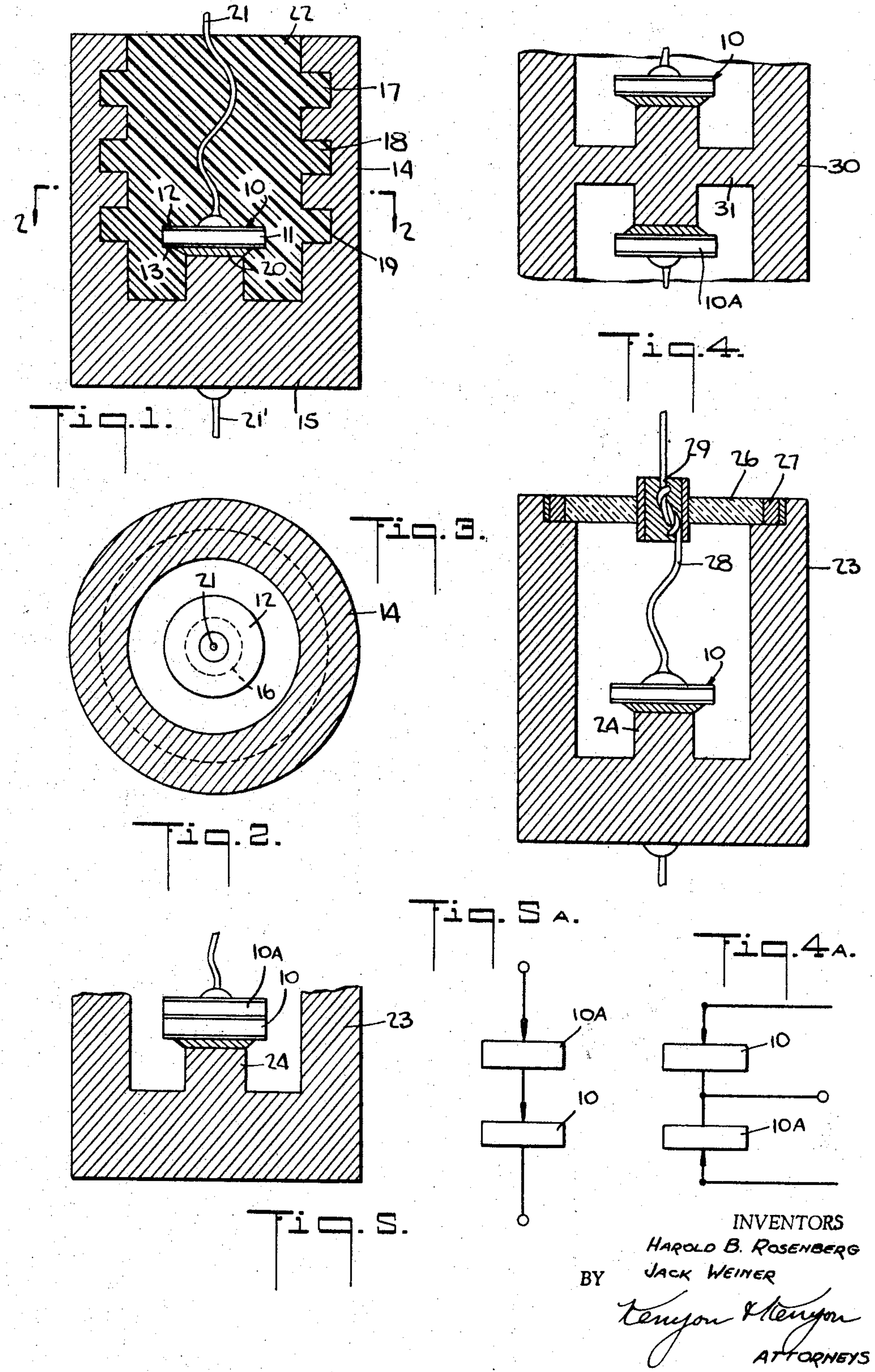
FIG. 2 is a transverse section taken in the plane indicated by lines 2—2 in FIG. 1.
FIG. 3 is a longitudinal section of another preferred embodiment of a packaged diode of the hermetically sealed type in accordance with the invention.
FIG. 4 is a twin form of packaged rectifier.
FIG. 4A is a schematic electrical diagram of the rectifier shown in FIG. 4.
FIG. 5 is a stacked form of packaged rectifier.
FIG. 5A is a schematic diagram of the device shown in FIG. 5.

Referring now to FIGS. 1 and 2, there is shown a protectively packaged diode, generally designated by numeral 10, and constituted by a cylindrical wafer 11 having upper and lower contact electrodes 12 and 13 plated thereon. The invention is of particular value in the packaging of semiconductor devices of the p-n junction type, especially silicon or germanium rectifiers, although the invention is not restricted to this application and may be used with other solid state components.

As is well known, if a body of semiconductive material has adjoining zones of the n-type and p-type, the junction between the two zones acts as a rectifying barrier offering a low resistance to current flow in one direction while presenting a high resistance in the reverse direction.

Such wafers are very thin, but since the forward resistance is inversely proportional to the cross-sectional areas of the wafer, it is desirable that such areas be relatively large. It is therefore standard practice for such wafers to have a thickness on the order of .008 inch and a diameter up to one inch and over. The electrodes 12 and 13, which may be in the form of a nickel or silver-plated layer on opposing faces of the wafer, ordinarily each have a thickness of .001 inch. Such wafers are extremely fragile and must be carefully protected.

It is important that the exposed edge of the wafer, which is not necessarily circular, be free of contaminants and that the wafer be sealed against moisture to prevent the formation of surface leakage paths across the junction which lies between the two end electrodes. In practice, after the nickel electrodes are plated on the opposing faces of the wafer, the nickel is sintered to assure an effective bond to the wafer. The wafers are then etched, with an acid solution, and the clean wafers are then rinsed and dried.

The package for the wafer is constituted by a cylindrical metal cup 14 having a base 15 and a circular pedestal 16 projecting upwardly from the center of the base to provide a mount for the wafer. The interior wall of the cup is indented to form a series of annular grooves 17, 18 and 19. The cup is preferably made of a metal of high thermal conductivity such as brass plated with silver. The cup and the base thereof is relatively thick-walled to afford an effective heat sink to dissipate heat quickly.

The wafer is mounted on the pedestal by soldering the lower electrode 13 to the head of the pedestal, the solder being uniformly spread thereon to form a connecting layer 20. The upper electrode 12 is soldered to a lead wire 21 which is preferably silver-plated and is sinuously or zigzag shaped to minimize any thermal or mechanical stresses that might be applied to the semiconductor through the wire. The zigzag shape of the wire also protracts the leakage path for moisture travelling along the wire.

After the wafer is soldered on its pedestal mount and the lead 21 is attached, it may be desirable to clean the surfaces, particularly if flux is used in the soldering. This cleaning may be accomplished ultrasonically in conjunction with a solvent such as warm trichloroethylene. It may also be desirable after the sensitive surface of the wafer is clean to apply a protective coating to repel moisture, such as a layer of silanes. For example, Dow Corning silicone varnish 996 or 997 diluted with xylene may be used for this purpose.

Finally, the wafer is potted by an insulating substance 22 filling the entire cup. Suitable for this purpose is an epoxy which may be mixed with a powdered alumina filler as well as a black pigment. The potting compound may be applied by means of a wooden stick. It will be noted that the potting compound enters the grooves 17, 18 and 19, and thereby is locked into the cup. The grooves also act to extend the leakage path of moisture along the interior wall of the cup to the wafer. A second lead 21' is welded to the bottom of the cup, thereby making connection with the bottom electrode 13 of the semiconductive wafer and completing the diode circuit.

It is also important to note that the diameter of the wafer is somewhat greater than that of the pedestal so that the sensitive edge surface thereof is entirely clear of the pedestal and is elevated above the base, thereby isolating this surface. The arrangement is such that the wafer is protected against light, humidity, heat and mechanical stresses to provide a rectifier of high efficiency whose characteristics are uniform and stable.

Referring now to FIG. 3, there is shown another embodiment of the invention in which the wafer 10 is contained in a metal cup 23 having a central pedestal 24 providing a mount for the wafer. The interior of the cup is however not grooved, for the cup in this instance is hermetically sealed against moisture.

The mouth of the cup is provided with an annular shoulder 25 adapted to receive a disc-shaped glass seal 26 encircled by a metal ring 27 which is soldered into the shoulder. A metal sleeve is mounted axially within disc 26 to receive a lead wire 28, preferably of silver, connected to the upper electrode 12 of the wafer. An external lead 29 is also inserted in the sleeve and solder is flowed therein to interconnect the wires and to seal the cup. In practice, before the cup is sealed it is evacuated and then filled with an inert gas such as nitrogen.

The twin arrangement shown in FIG. 4 is composed of an integral pair of units each one of which may be similar to that of FIG. 1 or 3. The pairing of diodes is effected by means of a double cup 30 having a base 31 which is common to both containers, a pedestal projecting from opposite surfaces of the base to support the individual wafers 10 and 10A. This arrangement is useful in providing in compact form a full wave rectifier circuit, as shown schematically in FIG. 4A and may also be used for such circuits as doublers.

In FIG. 5, there is shown a stacked arrangement of rectifiers which may be potted or hermetically sealed in a container in the manner described above. In this arrangement, the wafers 10 and 10A are connected in series by soldering the top electrode of wafer 10 to the bottom electrode of wafer 10A. Obviously a greater number of series connected wafers may be used.

It will be noted that in the construction disclosed herein, no damage of the wafers can occur due to flexing of the connecting leads and that the wafers are fully protected within their housing. The unit may readily be wired into rectifier circuits and need not be mounted in any special manner on a chassis or otherwise.

While there have been shown what are considered to be preferred embodiments of the invention, it will be manifest that many changes and modifications may be made therein without departing from the essential spirit of the invention. It is intended, therefore, in the annexed claim to cover all such changes and modifications as fall within the true scope of the invention.

What is claimed is:

A packaged semiconductive device comprising a semiconductive wafer having two electrodes at opposing faces thereof, a cylindrical metal cup for housing said wafer and having a base and a pedestal thereon, one electrode of said wafer being bonded to said pedestal to elevate said wafer above said base, the diameter of said pedestal being smaller than that of said wafer whereby the edge of said wafer is free of said pedestal, the full length of the interior wall of said cup being circumferentially corrugated to extend the moisture leakage path to said wafer, a lead wire connected to the other electrode of said wafer and extending from said cup, and a potting compound filling said cup to seal the wafer therein.

References Cited by the Examiner

UNITED STATES PATENTS

| | | | |
|---|---|---|---|
| 2,703,855 | 3/55 | Koch et al. | 317—234 |
| 2,712,619 | 7/55 | Zetwo | 317—234 |
| 2,945,992 | 7/60 | Bollert et al. | 317—234 |
| 2,981,873 | 4/61 | Eannarino et al. | 317—234 |
| 3,037,155 | 5/62 | Zielasek | 317—234 |

FOREIGN PATENTS

| | | |
|---|---|---|
| 1,242,208 | 8/60 | France. |

DAVID J. GALVIN, *Primary Examiner.*

GEORGE N. WESTBY, JAMES D. KALLAM, *Examiners.*